United States Patent [19]

Takeya et al.

[11] Patent Number: 4,983,004

[45] Date of Patent: Jan. 8, 1991

[54] APPARATUS FOR THREE-DIMENSIONAL VIEWING OF MAGNETIC RESONANCE IMAGING TOMOGRAMS

[75] Inventors: Naoya Takeya, Higashi-Murayama; Kazuhiro Honma; Kiyofumi Matsuda, both of Tsukuba, all of Japan

[73] Assignee: Agency of Industrial Science & Technology, Ministry of International Trade & Industry, Tokyo, Japan

[21] Appl. No.: 556,464

[22] Filed: Jul. 24, 1990

[30] Foreign Application Priority Data

Jul. 25, 1989 [JP]  Japan .................................. 1-192387

[51] Int. Cl.$^5$ ...................... G03H 1/02; G01R 33/48; A61B 5/055
[52] U.S. Cl. .................................. 350/3.66; 350/3.81; 350/3.6; 364/413.13
[58] Field of Search ...................... 350/3.6, 3.66, 3.67, 350/3.76, 3.81, 3.85, 130, 330, 345; 324/300, 312, 318; 364/413.19, 413.22, 413.13

[56] References Cited

U.S. PATENT DOCUMENTS 4,669,812  6/1987  Hoebing .............................. 350/3.78

Primary Examiner—Bruce Y. Arnold
Assistant Examiner—David R. Parsons
Attorney, Agent, or Firm—Oblon, Spivak, McClelland, Maier & Neustadt

[57] ABSTRACT

A plurality of liquid crystal displays, each able to independently display one of a plurality of MRI tomograms, is dispersed such that the display screen of each appear planar from a common point and are positioned such that the spacing between each display screen and the next one in front or back and of it is proportional to the spacing between the cross sections belonging to the MRI tomograms displayed by those display screens. A hologram screen is provided in position facing the display screens of the plurality of displays. By illuminating the plurality of displays with light from behind, light passing through each of the display screens will impinge on the hologram screen, and part of this light will be diffracted backwards by the hologram screen, causing virtual images of the MRI tomograms to appear in front of the hologram screen.

3 Claims, 5 Drawing Sheets

APPARATUS FOR THREE-DIMENSIONAL VIEWING OF MAGNETIC RESONANCE IMAGING TOMOGRAMS

BACKGROUND OF THE INVENTION

1. Field of the Invention

This invention relates to an apparatus for three-dimensional viewing of MRI tomograms which permits non-invasive viewing of tissues inside a living body three-dimensionally and in real time.

2. Prior Art Statement

The technique of magnetic resonance imaging (MRI) is making major contributions to various fields of modern medicine. MRI allows tomograms of tissues at any cross section within a living body to be represented as images of light and dark contrast. Moreover, this contrast is based on variations in the types and proportions of the constituent atoms in the chemical substances which make up these tissues, so images can be obtained which emphasize only particular portions of the tissues which have the same chemical composition, e.g. blood vessels only, bones only or abnormal tissues occurring on internal organs.

The MRI scanners used for such MRI are able to obtain three-dimensional information regarding tissues within the body, but the images actually displayed as output are limited to tomograms of one selected cross section among many mutually-parallel cross sections which are cut thinly to a selected width perpendicular to one selected direction. Since these are two-dimensional images, when attempting to view inside tissues within the body with this apparatus, one must select these cross sections and view the resulting tomograms one at a time on a display. In order to view several tomograms simultaneously, the images must be developed on film or the like, thus taking time which prevents real-time diagnosis and treatment, possibly delaying treatment. Furthermore, even when developed, accurate visual reconstruction of the original tissue in three dimensions from the individual tomograms is difficult, requiring a large amount of experience.

The present invention came about in light of the above, and its object is to provide an apparatus for three-dimensional viewing of MRI tomograms which is able to reconstruct a plurality of tomograms at mutually-parallel cross sections as a group of virtual images lined up in one direction to give the same perception of depth as if they were in their original positions within the bodily tissue, which can be viewed by the observer three-dimensionally in real time; thereby eliminating the labor and time required for film development, and also allowing the point of view to be moved to allow a desired portion to be seen, as in the case when a shadow in one tomograph in the foreground obscures a portion of a tomograph behind it which one wishes to view.

OBJECT AND SUMMARY OF THE INVENTION

In order to achieve the above object, the present invention is an apparatus for three-dimensional viewing of MRI tomograms which is able to reconstruct MRI tomograms with the correct depth superimposed along a straight line. The invention comprises: a frame member which can store a plurality of MRI tomograms; an image display means provided with a plurality of liquid crystal displays connected to the frame member, each of which is able to independently display one of the plurality of MRI tomograms and is dispersed such that the display screens of each all appear planar when seen from a common point and are positioned such that the spacing between each display screen and the next one in front or back of it is proportional to the spacing between the cross sections belonging to the MRI tomogram displayed by those display screens; and a hologram screen mounted in the common point at which it faces each of the liquid crystal displays; wherein the hologram screen records multiple interference fringes of light with which it was illuminated at said mounting position from the positions of each of the liquid crystal displays.

In an apparatus for three-dimensional viewing of MRI tomograms comprised as such, the liquid crystal display are illuminated with coherent light from behind while displaying the individual MRI tomograms by means of differing light intensities due to the contrast of high or low light transmission based on the orientation of the liquid crystals, and thus the coherent light is transmitted through the liquid crystals at differing transmittances at different positions on the screen, corresponding to the light intensities comprising the MRI tomograms. When this transmitted light impinges on the hologram screen, part of the light is diffracted behind the hologram screen when passing through the hologram screen, but to an observer watching this light from a viewing position behind the hologram screen, this diffracted light appears to come from in front of the hologram screen, causing the observer to see virtual images of the MRI tomograms made up of dark and light contrast. These virtual images are positioned in front of the hologram screen at a distance equal to the distance from the MRI tomogram on the original liquid crystal display to the position of incidence on the hologram screen.

By reconstructing such a virtual image simultaneously from all of the liquid crystal displays or by dispersing the timing of the virtual images over a range, the MRI tomograms of all of the mutually-parallel cross sections can be viewed three-dimensionally in front of the hologram screen lined up with depth along a straight line.

The above and other features and objects of the invention will become apparent with the following detailed description made with reference to the attached drawings.

DETAILED DESCRIPTION OF THE PREFERRED EMBODIMENT

Figure 1:
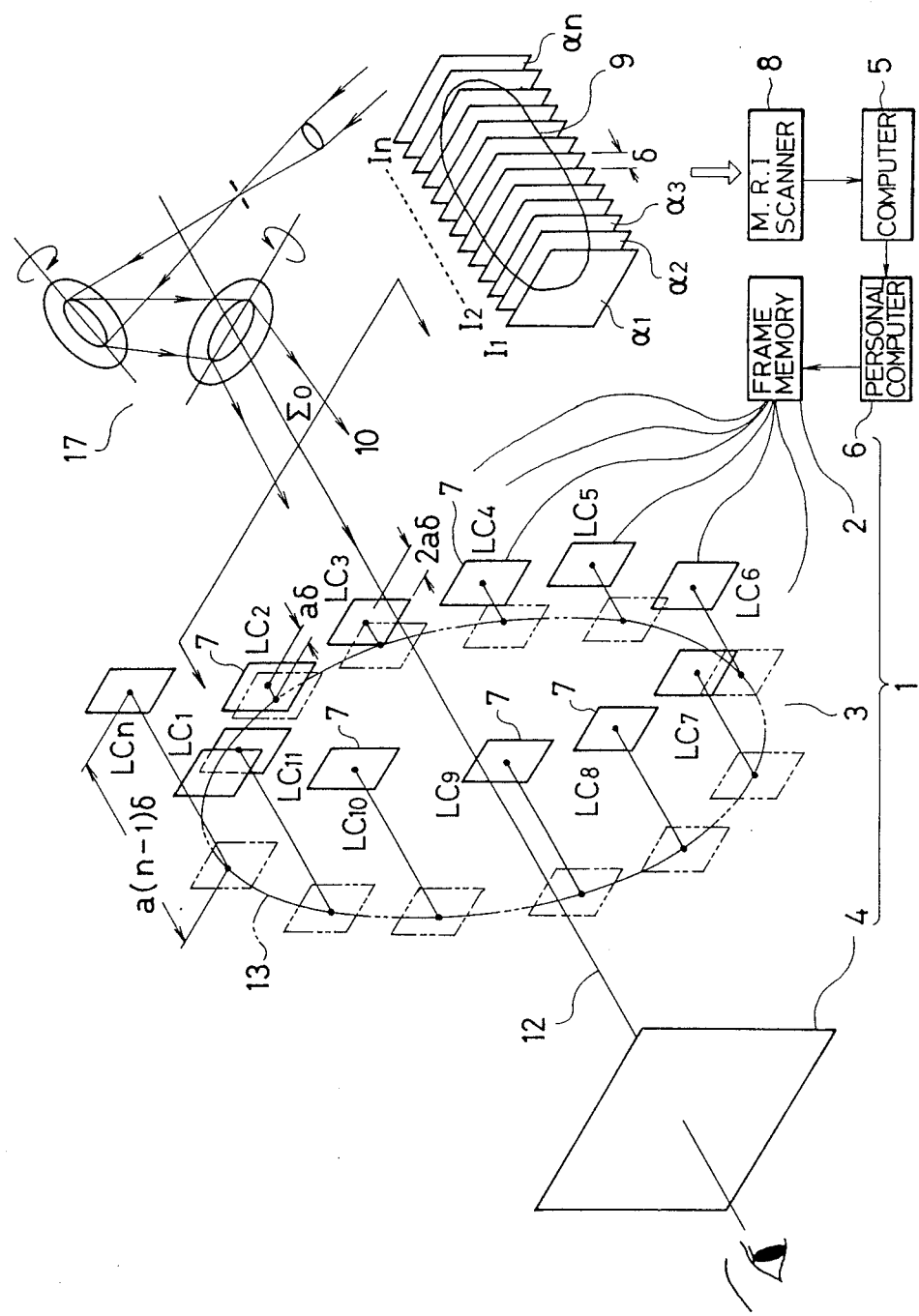
FIG. 1 is a perspective view of an apparatus for three-dimensional viewing of MRI tomograms of one preferred embodiment of the invention.

Here follows a detailed description of the invention with reference to the drawing.

In FIG. 1, the symbol 1 indicates an apparatus for three-dimensional viewing of MRI tomograms of the present invention. The apparatus for three-dimensional viewing of MRI tomograms 1 is provided with a frame memory 2, an image display apparatus 3 and a hologram screen 4.

Three-dimensional data contained in a plurality of mutually-parallel cross section $\alpha_1, \alpha_2, \ldots \alpha_n$ of bodily tissue 9 obtained by a MRI scanner 8 is subjected to three-dimensional high-speed image processing by a computer 5, after which, n two-dimensional images $I_1, I_2, \ldots, I_n$ formed by a personal computer 6 are stored in a frame member 2.

Figure 2:
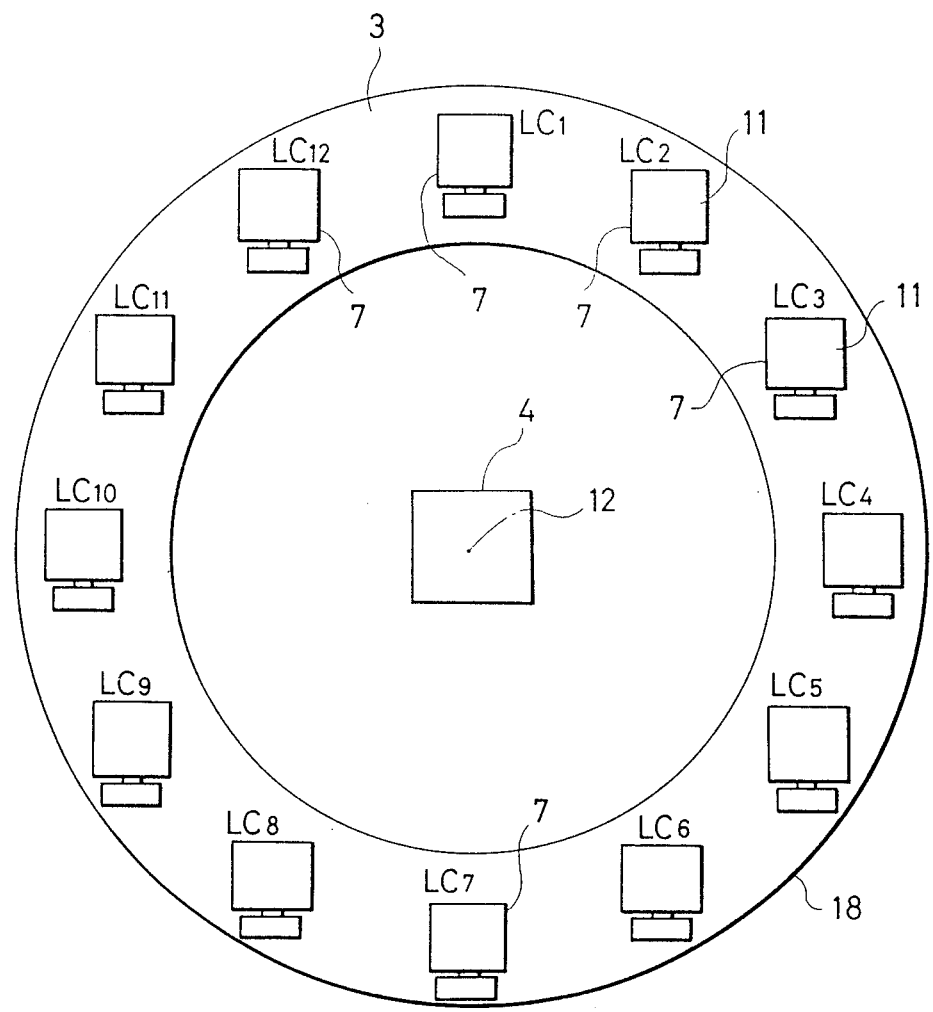
FIG. 2 is a plan view of the image display apparatus of the apparatus for three-dimensional viewing of MRI tomograms of FIG. 1.
Figure 3:
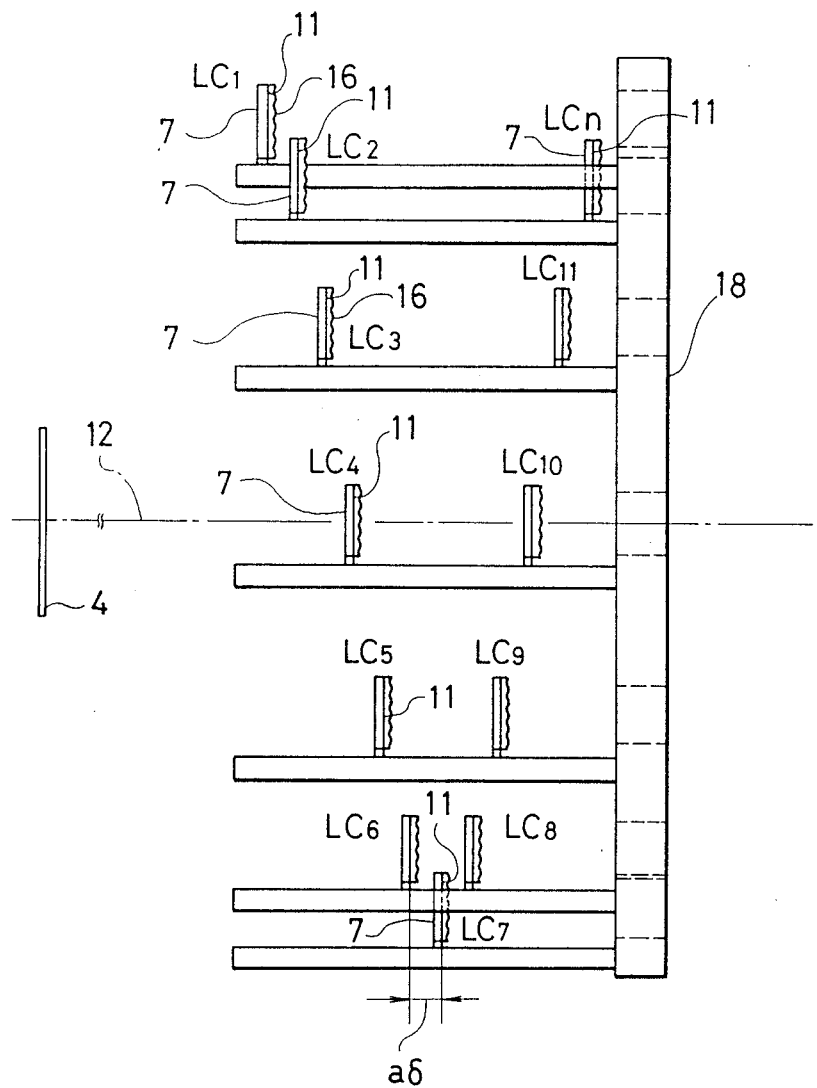
FIG. 3 is a right-side view showing the disposition of liquid crystal displays in the image display apparatus.

The image display apparatus 3 is provided with n liquid crystal displays 7 ($LC_1, LC_2, \ldots, LC_n$) and each of the liquid crystal displays 7 is connected to the frame memory 2 so that liquid crystal display $LC_1$ displays image $I_1$, liquid crystal display $LC_2$ displays image $I_2$, . . . , and liquid crystal display $LC_n$ displays image $I_n$, each independently of the others. As shown in FIGS. 2 and 3, these n liquid crystal displays 7 are supported and separated by an appropriate support member 18 in such way that each can be moved back and forth and their display screens 11 can be pointed in any direction. The details of the support member 18 are not pertinent to the present invention, so let it suffice to say that the member may be readily constructed of a combination of common-knowledge devices.

In the illustrated preferred embodiment, displays $LC_1, LC_2, \ldots, LC_{12}$ are disposed in order upon the support member 18 at equal spacing around a cylinder centered about axis 12. As shown in FIG. 3, the position along axis 12 of the display screens 11 of each of these liquid crystal displays 7 varies from that of the previous screen by a distance proportional to the spacing between the cross sections belonging to the MRI tomograms displayed on those display's display screens.

To wit, if the spacing along axis 12 between display $LC_1$ and display $LC_k$ ($k=1, 2, 3, \ldots, n$) is given by "$a(k-1)\delta$," where "a" is a constant and "$\delta$" is an equal distance between images of MRI tomograms. Therefore, if the liquid crystal displays 7 were disposed along the same axis, the spacing between their display screens 11 would be proportional to the spacing $\delta$ between cross sections $\alpha_1, \alpha_2, \ldots, \alpha_n$. In addition, the display screen 11 of each liquid crystal display 7 is pointed to face a hologram screen 4, to be described later, which is disposed on an extension of the axis 12.

Diffusion plates 16 are mounted on the back surfaces of the liquid crystal displays 7 to diffuse the coherent light 10 incident from behind.

The hologram screen 4 is disposed on an extension of the axis 12 at a certain distance at which it can face the display screens 11 of all of the liquid crystal displays 7 in the image display apparatus 3.

Figure 4:
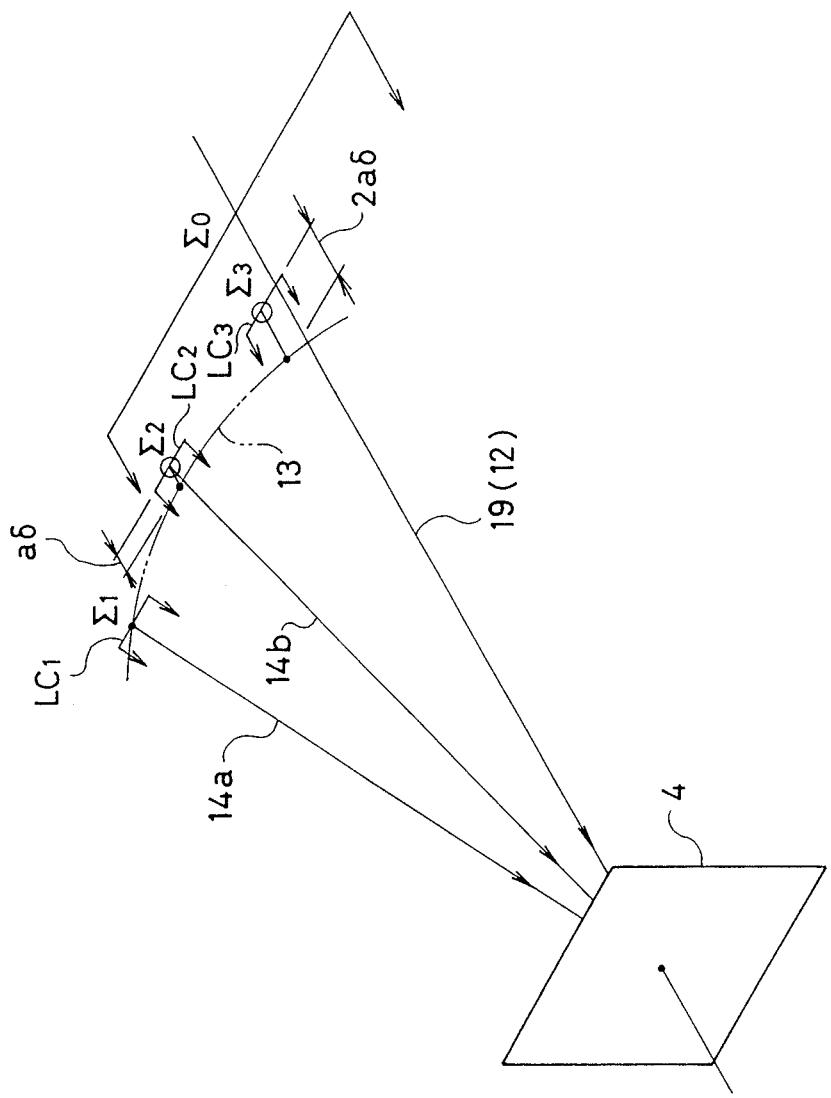
FIG. 4 is a perspective view showing one method of creating the hologram screen.

As shown in FIG. 4 when in aforementioned mounting position, this hologram screen 4 records the interference fringe between coherent light 14a from a light source $\Sigma_1$ along the optical axis connecting the aforementioned mounting position and the position of the display screen 11 of liquid crystal display $LC_1$ and coherent light 19 from light source $\Sigma_0$ along the axis 12. Then, the hologram screen 4 records the interference fringe between coherent light 14b from a light source $\Sigma_2$ along the optical axis connecting the hologram screen 4 and the position of the display screen 11 of liquid crystal display $LC_2$ and coherent light 19 from light source $\Sigma_0$ along the axis 12. And so in this manner, the hologram screen 4 eventually records multiple interference fringes of light source $\Sigma_0$ with light sources $\Sigma_k$ ($k=1, 2, \ldots, n$) at the positions of the display screens 11 of all of the liquid crystal displays $LC_k$.

Instead of changing the light source positions $\Sigma_k$ depending on k, the light source could be fixed at a be rotated about the axis 12 by $(k-1)\cdot(2\pi/n)$ revolutions, so the screen 4 consecutively records the interference fringe with the coherent light 19 at all values of k: namely $k=1, 2, 3, \ldots, n$.

Here follows an explanation of a method of using the apparatus for stereoscopic viewing of MRI tomograms 1 to view tomograms $I_1, I_2, \ldots, I_n$ three-dimensionally.

First, parallel cross sections of the tissue to be observed as obtained from the MRI scanner are subjected to image processing by the computer 5 and the plurality of two-dimensional cross-section image signals thus obtained are sent by the frame memory 2 to the individual liquid crystal displays 7 in the image display apparatus 3.

Each of the liquid crystal displays 7 is moved a specified distance in the axial direction based on its cross-section image signal and adjusted so that its display screens 11 faces the hologram screen 4.

Figure 5:
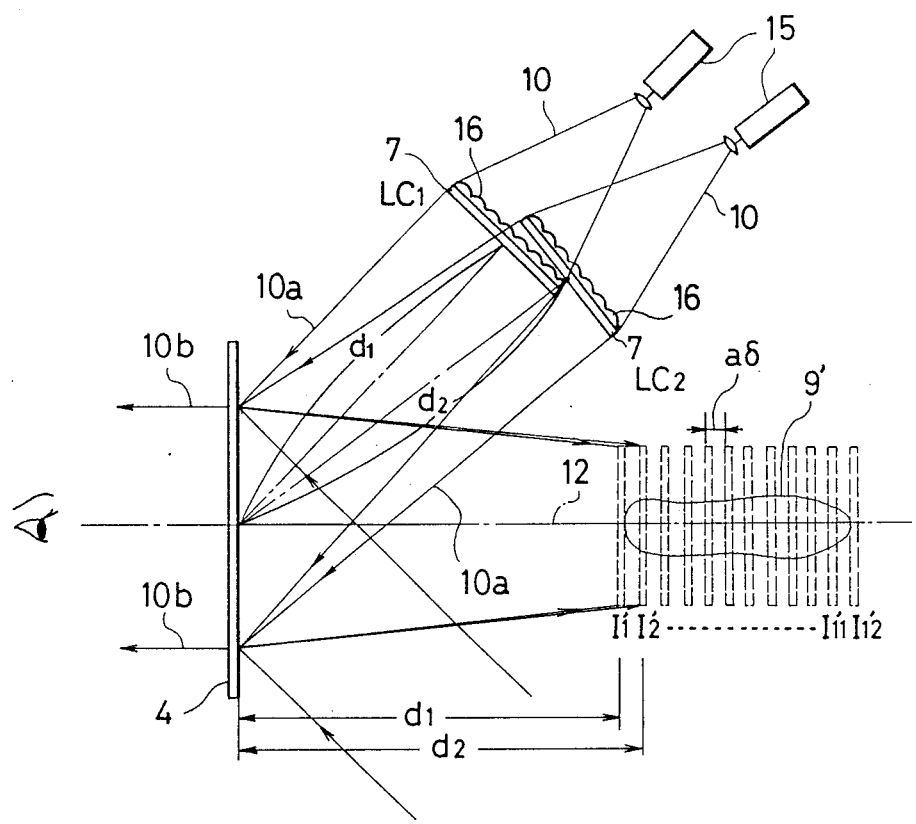
FIG. 5 is an explanatory diagram showing the display of virtual images of tomograms in the apparatus for three-dimensional viewing of MRI tomograms of the invention.

Next, with each of the liquid crystal displays 7 displaying their own cross-section images, as shown on FIG. 5, the back surface of each of the liquid crystal displays 7 is illuminated with coherent light 10 via the diffusion plates 16. An example of one method of generating this illuminating light 10 is shown in the preferred embodiment of FIG. 1, in which a light-oscillating apparatus 17 made up of a combination of two galvanometers or polygon mirrors is used to scan the light over the diffusion plate on the back of each display and thus illuminate each display in turn for a period of time within the range required to form a virtual image. Naturally, as shown in FIG. 5, lasers 15 could be provided on the back surface of each of the displays so that each of the displays 7 can be simultaneously illuminated with laser light 10 via the diffusion plates 16.

The light 10a which passes through the display screens 11 of each of the liquid crystal displays $LC_1$, $LC_2, \ldots$, together impinges on the hologram screen 4.

The hologram screen 4 thus records the interference fringe formed between light from the direction of axis 12 and light along the optical axes connecting each display and the screen. Therefore, when the light 10a passes through the hologram screen 4, part of that light 10b is diffracted in the direction of axis 12, so to a person observing this light 10b from behind the hologram screen 4, the light 10b appears to be coming from in front of the hologram screen 4 and the virtual image is apparently positioned apart from the hologram screen 4 by a distance $d_1$ equal to the length of light 10a. Thus, the observer will see a virtual image $I_1'$ of the tomogram $I_1$ at a position a distance of $d_1$ from the hologram screen 4 along axis 12.

In this manner, when the observer watches the hologram screen 4 from behind the hologram screen 4, virtual images $I_1', I_2', \ldots, I_n'$ of tomograms $I_1, I_2, \ldots, I_n$ can be seen to be lined up along an axis on the opposite side of hologram screen 4. Since the virtual images $I_1'$, $I_2', \ldots, I_n'$ appear to have the same portions and spacing between them as the tomograms $I_1, I_2, \ldots, I_n$, and image of the tissue 9' appears in the virtual images complete with a perception of depth.

In such a case in which the image of a posterior portion of the tissue is obscured by the image of an anterior portion, the image of the portion one wishes to view can be moved to the front of the image, and moreover, due to the properties of the hologram screen, hidden portions can also be seen to a certain degree by merely changing the observer's point of view.

As is evident from the above explanation, by means of the invention, tomograms at a plurality of mutually-parallel cross sections can be reconstruct red as a group of virtual images lined up in one direction to give the same perception of depth as if each was in the same position as in the original bodily tissue, which can be viewed by the observer three-dimensionally in real time; thereby eliminating the labor and time required for film development, and also allowing the point of view to be moved to allow a desired portion to be seen, as in the case when a shadow in one tomograph in the foreground obscures a portion of a tomograph behind it which one wishes to view.

Furthermore, when one wishes to view a desired portion in detail, the MRI scanner can be directed to obtain tomograms of that portion which is then displayed on the liquid crystal displays, so that the desired portion can be easily observed in detail with a sense of depth, thus making a great contribution to the accuracy and speed of MRI diagnosis and treatment.

What is claimed is:

1. An apparatus for three-dimensional viewing of MRI tomograms, comprising:

a frame memory capable of storing a plurality of MRI tomograms;

image display means comprising a plurality of liquid crystal displays connected to said frame member, each of said liquid crystal displays having a display screen and being capable of independently displaying one of the plurality of MRI tomograms on said display screen, said liquid crystal displays being disposed such that their display screens appear planar when seen from a common point and being positioned such that the spacing between each display screen and the next one in front or back of it is proportional to the spacing between the cross sections belonging to the MRI tomograms displayed on the display screens;

a hologram screen having a center disposed at a position corresponding to said common point so that it faces each of said liquid crystal displays, and having recorded thereon multiple interference fringes of light obtained by illuminating said hologram screen with said light from the positions of said liquid crystal displays; and means for illuminating the rear surfaces of the display screens with coherent light.

2. The apparatus according to claim 1, wherein the display screens are disposed roughly equidistantly about a ring shaped support.

3. The apparatus according to claim 1, wherein the illuminating means comprises a laser disposed behind the display screens.

* * * * *